(12) United States Patent
Kim et al.

(10) Patent No.: US 7,697,340 B2
(45) Date of Patent: Apr. 13, 2010

(54) METHODS AND APPARATUSES FOR TRIMMING REFERENCE CELLS IN SEMICONDUCTOR MEMORY DEVICES

(75) Inventors: Chae-Hoon Kim, Yongin-si (KR); Dae-Han Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 178 days.

(21) Appl. No.: 11/806,587

(22) Filed: Jun. 1, 2007

(65) Prior Publication Data

US 2008/0137433 A1 Jun. 12, 2008

(30) Foreign Application Priority Data

Dec. 7, 2006 (KR) .................. 10-2006-0123527

(51) Int. Cl.
*G11C 11/34* (2006.01)
(52) U.S. Cl. ................. 365/185.22; 365/185.2; 365/189.09
(58) Field of Classification Search ............. 365/185.22, 365/185.2, 189.09, 185.27, 185.16, 189.07
See application file for complete search history.

(56) References Cited

U.S. PATENT DOCUMENTS

| 6,205,056 | B1 | 3/2001 | Pan et al. |
|---|---|---|---|
| 6,504,394 | B2 | 1/2003 | Ohlhoff |
| 6,785,163 | B2 * | 8/2004 | Yeh et al. .................. 365/185.2 |
| 2004/0170062 | A1 * | 9/2004 | Micheloni et al. ....... 365/185.29 |
| 2007/0133319 | A1 * | 6/2007 | Noichi .................. 365/189.09 |
| 2007/0140003 | A1 * | 6/2007 | Ido .......................... 365/185.2 |
| 2008/0224774 | A1 * | 9/2008 | Tran et al. ................... 330/253 |

FOREIGN PATENT DOCUMENTS

| JP | 2001-216040 | 8/2001 |
|---|---|---|
| JP | 2003-527725 | 9/2003 |
| KR | 10-2001-0062424 | 7/2001 |
| KR | 10-2001-0065155 | 7/2001 |
| KR | 2003-0014367 | 2/2003 |

* cited by examiner

*Primary Examiner*—Dang T Nguyen
(74) *Attorney, Agent, or Firm*—Harness, Dickey & Pierce, P.L.C.

(57) ABSTRACT

A method and apparatus for trimming a reference cell in a semiconductor memory device are provided. The method includes generating an internal bias current capable of being trimmed, and trimming the reference cell based on the internal bias current. The semiconductor memory device includes a reference cell in which a reference cell current flows between a drain and a source based on a bias voltage, an internal bias current generator configured to generate an internal bias current capable of being trimmed, and a trimming circuit configured to trim the reference cell based on the internal bias current.

15 Claims, 6 Drawing Sheets

FIG. 5

| Case | CONDITION | CODE |
|---|---|---|
| Case1 | Iref<Imin | 00(code1) |
| Case2 | Imin<Iref<Imax | 01(code2) |
| Case3 | Iref>Imax | 11(code3) |

METHODS AND APPARATUSES FOR TRIMMING REFERENCE CELLS IN SEMICONDUCTOR MEMORY DEVICES

PRIORITY STATEMENT

This non-provisional U.S. patent application claims priority under 35 U.S.C. § 119 to Korean Patent Application No. 10-2006-0123527, filed on Dec. 7, 2006, the entire contents of which are incorporated herein by reference.

BACKGROUND

Conventional semiconductor memory devices, for example, flash memory devices compare a current of a reference cell with a current of a memory cell using a sense amplifier, and use the results of the comparison to identify whether the memory cell is a program cell or an erase cell. Conventionally, when programming memory cells in a flash memory device, programming and verifying a reference cell in the flash memory device (hereinafter, referred to as "reference cell trimming") may be needed to adjust a program voltage of the reference cell to a desired level. Such reference cell trimming may be performed by manufacturing engineers during fabrication of conventional flash memory devices.

FIG. 1 is a flowchart of a conventional method for trimming a reference cell in a semiconductor memory device. Referring to FIG. 1, in the conventional method, reference cell trimming may be performed using a bias current (or a bias voltage) input from a tester via an input/output (I/O) pad in the semiconductor memory device.

At S110, automatic trimming is performed on the reference cell. For example, the reference cell may be erased and programmed based on a given program bias voltage at S112. The reference cell may be implemented in the form of a transistor in which a source-drain current (hereinafter, referred to as a "reference cell current") flows based on the program bias voltage. For example, a given bias voltage greater than a bias voltage applied to a source region may be applied to a drain region and a gate of the reference cell to program the reference cell. At S114, the programmed reference cell may be verified based on an external bias current input from a tester. For example, the reference cell current may be compared with the external bias current and completion of the verification of the reference cell may be determined based on a result of the comparison. The programming and verification of the reference cell may be repeated until the reference cell current is within a given error range of the external bias current.

The programming and verification may be automatically performed in the semiconductor memory device and referred to as automatic trimming (e.g., S112 and S114).

At S120, a tester measures the reference cell current flowing in the reference cell. When the reference cell current measured by the tester is within the given error range of the external bias current at S130, the reference cell trimming terminates.

Returning to S130, if the reference cell current measured by the tester is not within the given error range of the external bias current, the tester may perform manual trimming of the reference cell at S140. When manually trimming, the reference cell of the semiconductor memory device may be programmed based on a program bias voltage (e.g., a voltage applied to the source, the gate, and the drain of the reference cell) supplied by the tester at S142, and the reference cell current of the programmed reference cell may be measured by the tester at S144. When the measured reference cell current has a requested current value (e.g., when the measured reference cell current is within a given error range of the external bias current) at S146, the manual trimming terminates. Returning to step S146, when the measured reference cell current is not within the given error range, the manual trimming may be repeated. The manual trimming may be repeated by changing the program bias current supplied by the tester.

FIG. 2 is a block diagram of a conventional semiconductor memory device 200 for performing the reference cell trimming illustrated in FIG. 1. Referring to FIG. 2, the semiconductor memory device 200 may include a reference cell 210, an I/O pad 215, a first comparator 220 and a voltage supply controller 230. During automatic trimming of the reference cell 210, the reference cell 210 may be programmed based on a bias voltage Vpg1 supplied by the voltage supply controller 230.

A reference cell current Iref1 may flow between a drain and a source of the reference cell 210 based on the bias voltage Vpg1. The first comparator 220 may compare an external bias current Ix input via the I/O pad 215 with the reference cell current Iref1 and output a comparison signal ST. The voltage supply controller 230 receives the comparison signal ST and may supply the bias voltage Vpg1 to the reference cell 210 based on the comparison signal ST.

In the conventional reference trimming in a conventional semiconductor memory device, a parasitic component may cause errors when the external bias current is supplied by the tester during the automatic trimming, which may decrease accuracy of the automatic trimming. In addition, to measure the reference cell current of each of a plurality of reference cells in the conventional semiconductor memory device during manual trimming, a parametric measure unit (PMU) in the tester may individually contact each reference cell, and thus, trimming test time for the reference cells in the semiconductor memory device may increase.

SUMMARY

Example embodiments relate to semiconductor memory devices, for example, methods and apparatuses for trimming a reference cell using an internal current source (e.g., an internal bias current source) in a semiconductor memory device. At least one example embodiment provides reference cell trimming methods and apparatuses having improved accuracy of reference cell trimming and/or decreased test time.

At least one example embodiment provides a method for trimming a reference cell in a semiconductor memory device. According to at least this method, an internal bias current may be generated, and the reference cell may be trimmed based on the internal bias current.

According to at least one other example embodiment, an internal bias current capable of being trimmed may be generated, and automatic trimming may be performed by programming the reference cell with a variable program voltage and verifying the programmed reference cell based on the internal bias current. Fine trimming of the trimmed reference cell may be performed based on at least two reference currents generated based on the internal bias current.

At least one other example embodiment provides a semiconductor memory device including a reference cell, an internal bias current generator and/or a timing circuit. According to at least this example embodiment, a reference cell current flows between a drain and a source in the reference cell based on a bias voltage for programming the reference cell. The internal bias current generator may generate an internal bias current capable of being trimmed, and the trimming circuit may trim the reference cell based on the internal bias current.

According to at least one other example embodiment, a semiconductor memory device may include a plurality of reference cells, at least one internal bias cell and/or a trimming circuit. In each of the reference cells, a reference cell current may flow between a drain and a source based on a bias voltage for programming the reference cell. The at least one internal bias cell may generate an internal bias current capable of being trimmed. The trimming circuit may trim at least one of the reference cells based on the internal bias current.

BRIEF DESCRIPTION OF THE DRAWINGS

The present invention will become more apparent by describing in detail example embodiments thereof with reference to the attached drawings in which:

FIG. 5 is a table illustrating digital codes generated corresponding to reference cell current according to an example embodiment.

DETAILED DESCRIPTION OF EXAMPLE EMBODIMENTS

Figure 1:
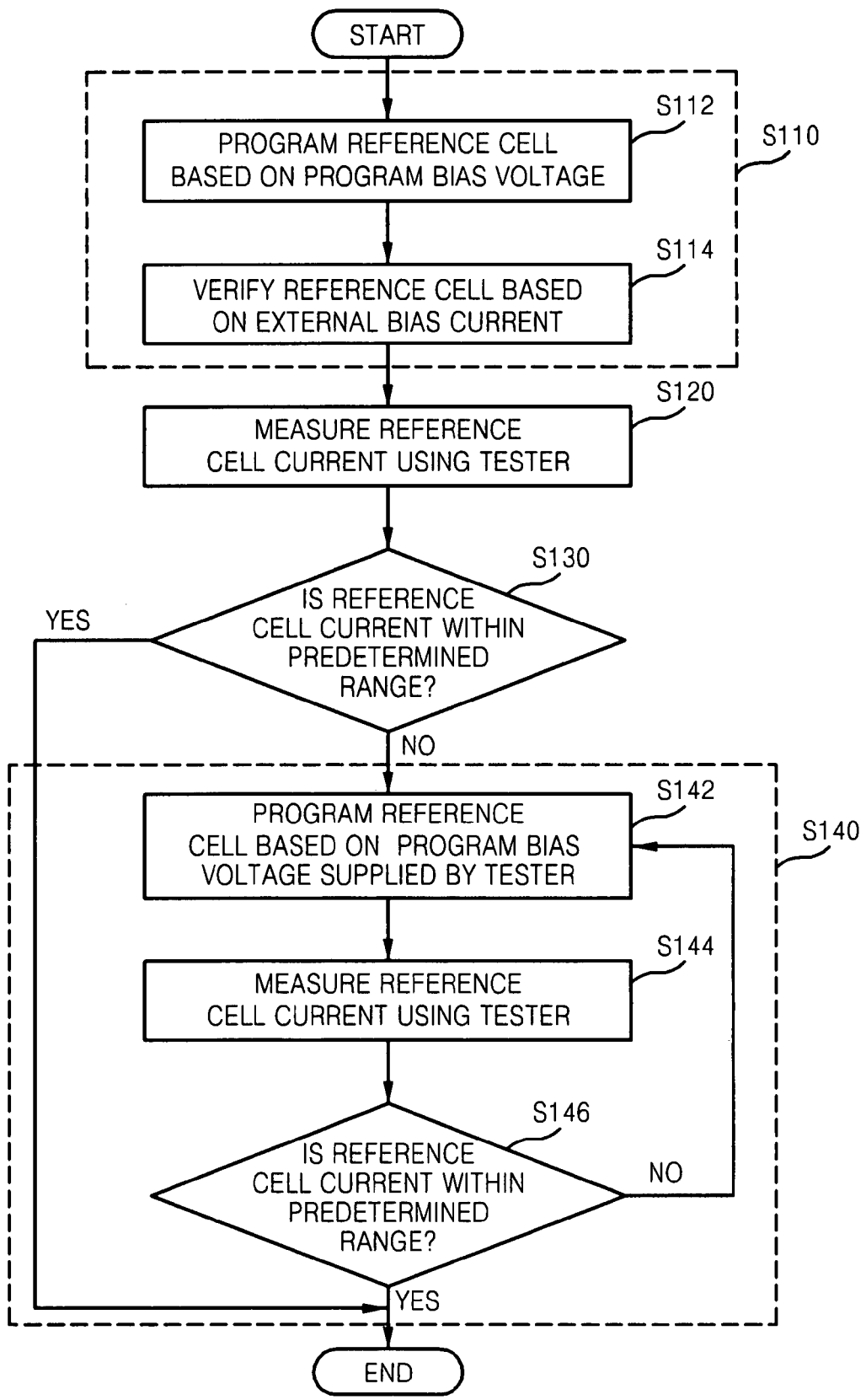
FIG. 1 is a flowchart of a conventional method of trimming a reference cell in a semiconductor memory device.
Figure 2:
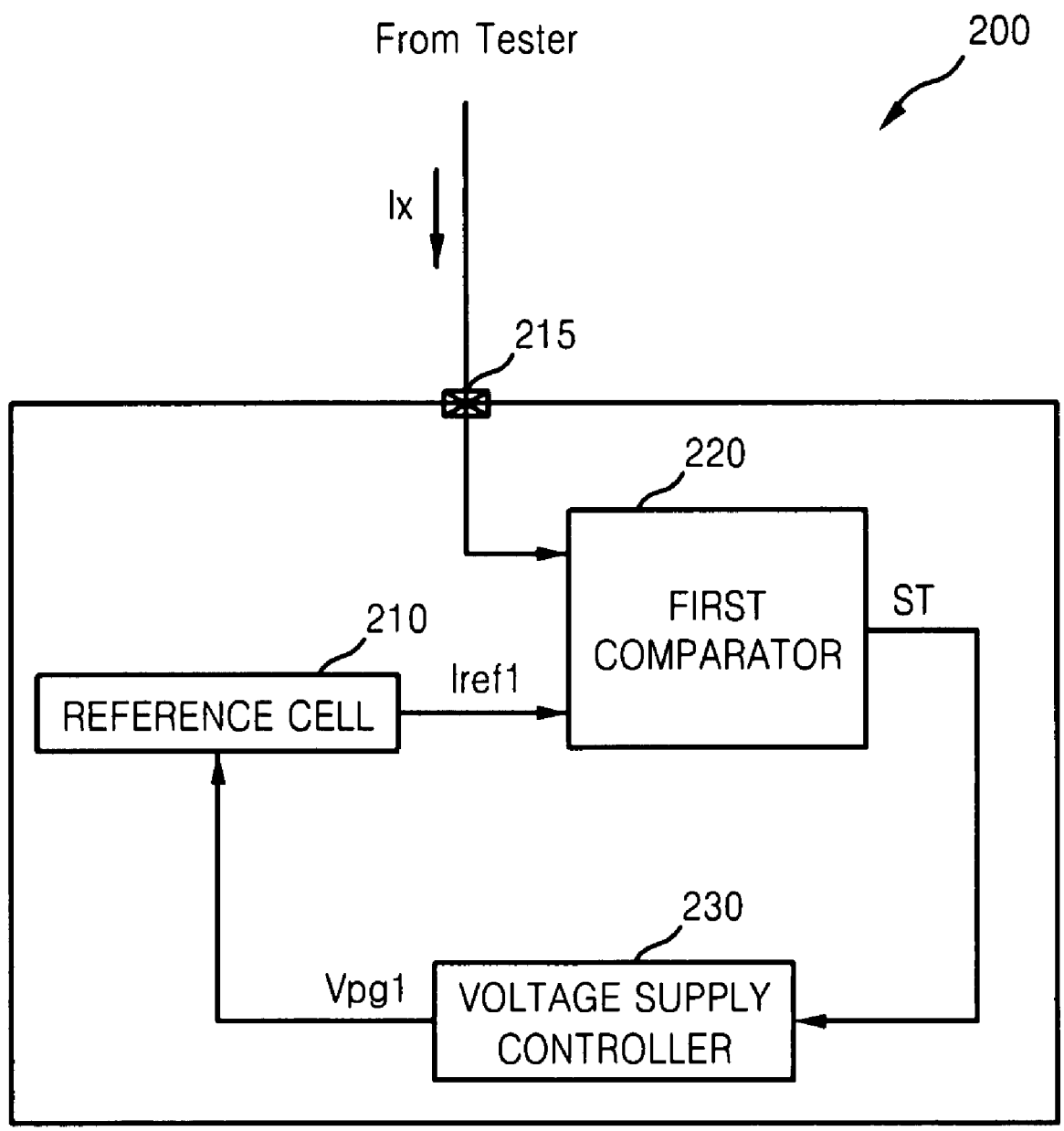
FIG. 2 is a block diagram of a conventional semiconductor memory device for performing the reference cell trimming illustrated in FIG. 1.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 3:
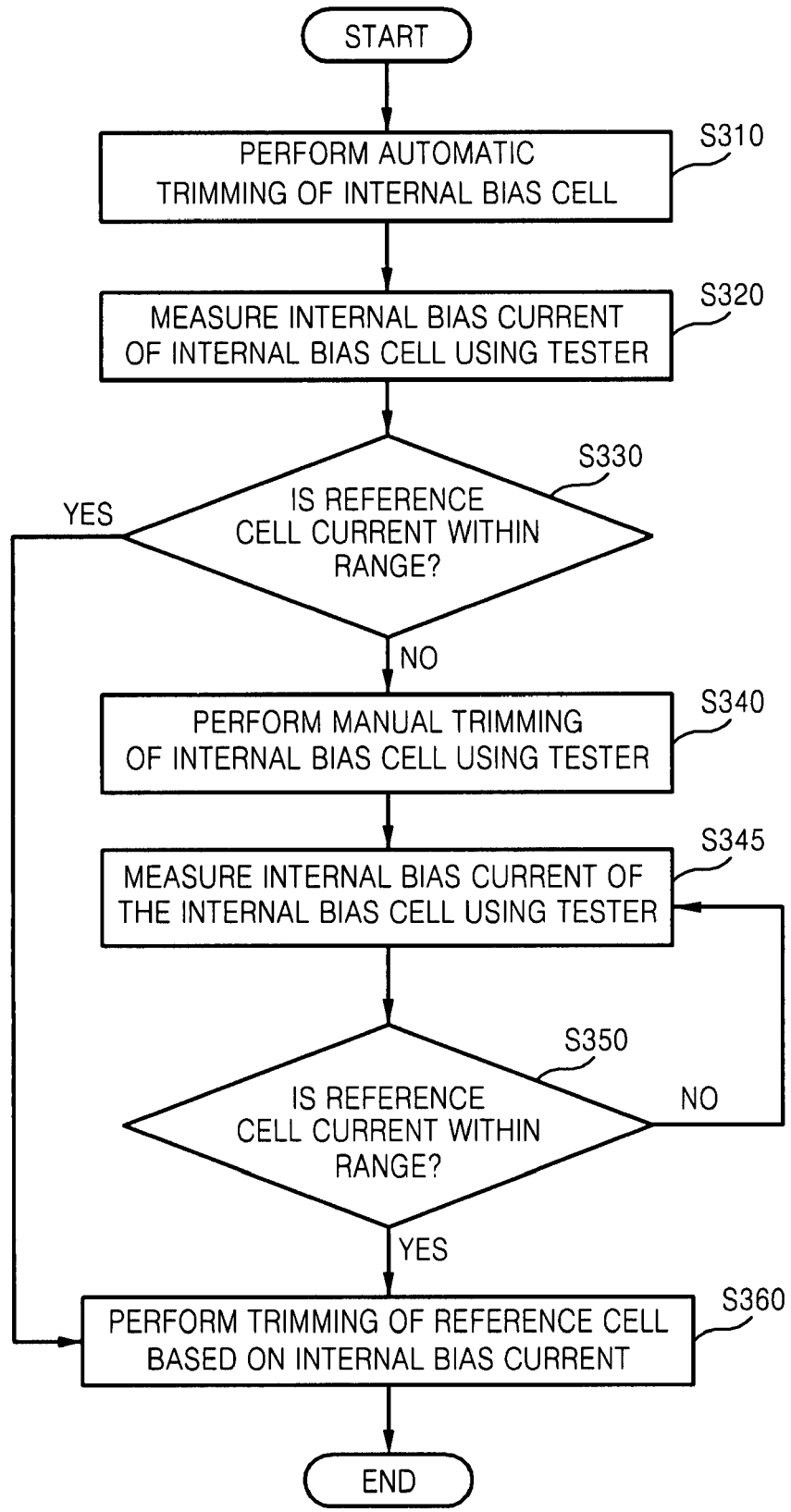
FIG. 3 is a flowchart of a method of trimming a reference cell in a semiconductor memory device according to an example embodiment.

FIG. 3 is a flowchart illustrating a method of trimming a reference cell in a semiconductor memory device according to an example embodiment.

Referring to FIG. 3, at S310, the semiconductor memory device may perform automatic trimming on an internal bias cell. The internal bias cell may be implemented using one or more transistors (e.g., as may be the case with flash electrically erasable and programmable read only memory (EEPROM), NOR flash EEPROM, NAND flash EEPROM, or the like). The one or more transistors may include a floating gate, a source region and a drain region. A source-drain current (hereinafter, referred to as an "internal bias current") may flow in the internal bias cell based on a bias voltage. The automatic trimming of the internal bias cell may include erasing, programming and/or verifying the internal bias cell, which may be performed by the semiconductor memory device.

In one example, the semiconductor memory device may erase the internal bias cell and program the erased internal bias cell based on a first bias voltage. The semiconductor memory device may verify the internal bias current of the internal bias cell, which may be programmed based on the first bias voltage, based on an external bias current input from a tester. For example, when the internal bias current is within a given error range of the external bias current, the verification is complete. If the internal bias current is not within a given error range, the semiconductor memory device may repeat the programming and the verification of the internal bias cell until the internal bias current is within the given error range.

At S320, a tester may measure the internal bias current of the internal bias cell. At S330, if the measured internal bias current is determined to be within a given error range of the external bias current, the automatic trimming of the internal bias cell is complete. Once automatic trimming of the reference cell is complete, the reference cell in the semiconductor memory device may be trimmed based on the internal bias current of the trimmed internal bias cell at S360. Trimming of the reference cell based on the internal bias current will be described in more detail below with regard to FIG. 4.

Returning to S330, if the measured internal bias current is not within the given error range from the external bias current, manual trimming of the internal bias cell may be performed at S340.

In one example, during the manual trimming, the internal bias cell may be programmed under the control of the tester. For example, the tester may supply a bias voltage for programming the internal bias cell (e.g., directly or indirectly) to the internal bias cell. Alternatively, the tester may supply a control signal for supplying the bias voltage to the reference cell to the semiconductor memory device.

At S345, the tester may measure the internal bias current of the internal bias cell, which may be programmed by the control of the tester. At S350, the tester may determine whether the measured internal bias current is within the given error range. If the measured internal bias current is not within the given error range, the tester may repeat the manual trimming of the internal bias cell as described above with regard to S345.

Returning to S350, if the measured internal bias current is within the given error range, the trimming of the internal bias cell is complete, and the reference cell may be trimmed based on the internal bias current of the trimmed internal bias cell at S360.

Figure 4:
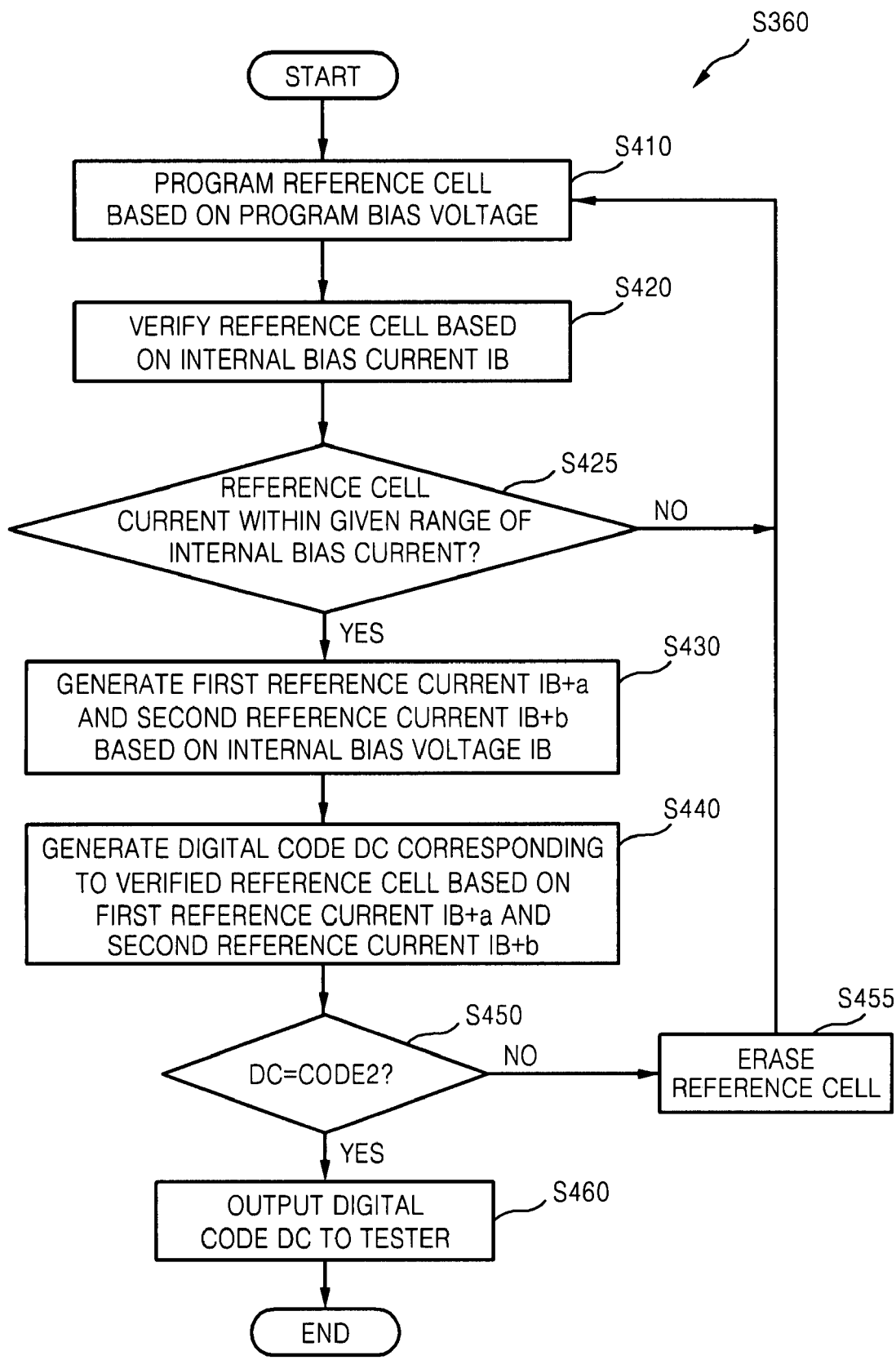
FIG. 4 is a flowchart of an operation of performing reference cell trimming based on an internal bias current according to an example embodiment.

FIG. 4 is a flowchart illustrating a method for trimming an internal bias current of a trimmed internal bias cell (e.g., S360 in FIG. 3) according to an example embodiment.

Referring to FIG. 4, the semiconductor memory device may program the reference cell based on a program bias voltage at S410. At S420 the semiconductor memory device may verify a drain-source current (e.g., a reference cell current of the programmed reference cell) based on the internal bias current. At S425, the semiconductor memory device may compare the reference cell current with the internal bias current. If the reference cell current is determined to be outside the given error range of the internal bias current, the semiconductor memory device may repeat the programming (S410) and the verification (S420) with respect to the reference cell.

Returning to S425, if the reference cell current is within a given error range of the internal bias current, the verification may be complete, and the process may proceed to S430. The program bias voltage for programming the reference cell may be a voltage, which is applied to at least one among a source, a drain and a gate of the reference cell to program the reference cell. The program bias voltage applied to the gate may be variable.

According to at least some example embodiments, when the reference cell is trimmed, the verification (S420) may be performed based on the internal bias current (e.g., an internal current source) instead of an external bias current input from an external tester. This may provide more accurate reference cell trimming than the conventional reference cell trimming.

Still referring to FIG. 4, at S430, the semiconductor memory device may generate a plurality of reference currents based on the internal bias current IB and perform fine trimming on the verified reference cell based on the plurality of reference currents. For example, the semiconductor memory device may generate a first reference current Imax (=IB+α) and a second reference current Imin (=IB+β) In this example, α and β are real numbers and α>β. The value of the first reference current Imax may be greater than or equal to the value of the second reference current Imin.

The semiconductor memory device may perform a finer or fine trimming on a current of the verified reference cell based on the first reference current Imax and the second reference current Imin.

At S440, the semiconductor memory device may generate a digital code DC corresponding to the reference cell current Iref of the verified reference cell based on the first reference current Imax and/or the second reference current Imin.

FIG. 5 is a table illustrating digital codes generated corresponding to reference cell current Iref illustrated in FIG. 4. Referring to FIG. 5, in Case2 where the reference cell current Iref flowing in the reference cell is less than the first reference current Imax and is greater than the second reference current Imin (Imin<Iref<Imax), the digital code DC may be a second code (e.g., 01, code2). In Case1 where the reference cell current Iref is less than second reference current Imin (Iref <Imin), the digital code DC may be a first code (e.g., 00, code1). In Case3 where the reference cell current Iref is greater than the first reference current Imax (Imax<Iref), the digital code DC may be a third code (e.g., 11, code3).

Referring back to FIG. 4, at S450, the semiconductor memory device may determine whether the digital code DC corresponding to the reference cell current of the verified reference cell is the second code (e.g., 01).

When the digital code DC is determined to be the second code (Case2), the semiconductor memory device may complete the trimming of the reference cell, and output the digital code DC to the tester at S460. If the digital code DC is not the second code (Case1 or Case3), the semiconductor memory device may erase the reference cell at S455, return to S410 and repeat.

In reference cell trimming methods according to at least some example embodiments, a semiconductor memory device may estimate the accuracy of trimming of the verified reference cell using the reference currents (e.g., the first reference current Imax and the second reference current Imin) generated based on the internal bias current and can perform finer trimming of the reference cell based on a result of the estimation. Accordingly, higher or high-accuracy reference cell trimming may be achieved using automatic trimming of the reference cell and not manual trimming. In addition, the reference cell current may not be needed to be measured for manual trimming using a parametric measure unit (PMU) of the tester, and therefore, test time may be reduced.

Figure 6:
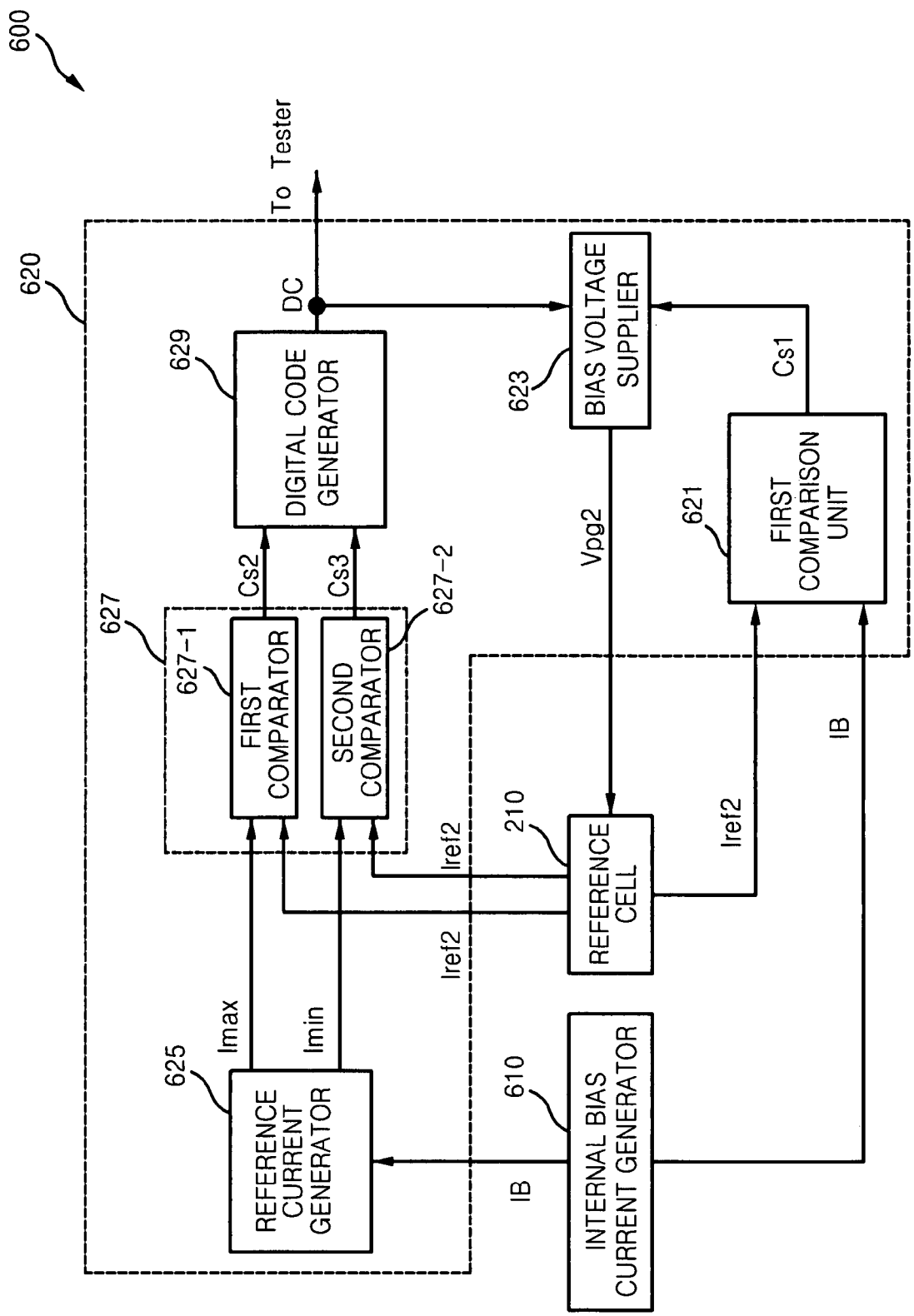
FIG. 6 is a block diagram of a semiconductor memory device for performing the reference cell trimming according to an example embodiment.

FIG. 6 is a block diagram of a semiconductor memory device according to an example embodiment. The semiconductor memory device 600 of FIG. 6 may perform methods for reference cell trimming according to example embodiments, for example, as illustrated in FIG. 3. For example purposes, the semiconductor memory device 600 will be discussed as being a NOR flash memory device. However, example embodiments may be applicable to any other flash memory devices or the like. Referring to FIG. 6, the semiconductor memory device 600 may include a reference cell 210, an internal bias current generator 610 and/or a trimming circuit 620.

The reference cell 210 may be programmed based on a bias voltage Vpg2 supplied by a bias voltage supplier 623. A reference cell current Iref2 may flow in the programmed reference cell 210. The bias voltage Vpg2 may be a voltage supplied to at least one of a source, a drain and a gate of the reference cell 210 to program the reference cell 210. The bias voltage Vpg2 supplied to the gate may be variable.

The internal bias current generator 610 may include an internal bias cell which may be trimmed. For example, the internal bias cell may be subjected to automatic trimming or manual trimming, as described above with regard to FIG. 3. Accordingly, the internal bias current generator 610 may function as an internal current source which may generate a given or desired internal bias current IB by trimming of the internal bias cell (e.g., the automatic trimming performed in S310 through S330 or the manual trimming performed in S340 through S350 of FIG. 3).

The trimming circuit 620 may include a first comparison unit 621, the bias voltage supplier 623, a reference current generator 625, a second comparison unit 627, the bias voltage supplier 623 and/or a digital code generator 629. The first comparison unit 621 may compare the reference cell current Iref2 flowing in the programmed reference cell 210 with the internal bias current IB generated by the internal bias current generator 610 and output a first comparison signal Cs1 based on a result of the comparison.

The bias voltage supplier 623 may supply the bias voltage Vpg2 for programming the reference cell 210 based on the first comparison signal Cs1. For example, the first comparison signal Cs1 may be output at a first level (e.g., one of a high logic level and a low logic level) when the reference cell current Iref2 is greater than the internal bias current IB, and may transition to a second level (e.g., the other of the high logic level and the low logic level) when the reference cell current Iref2 becomes equal to the internal bias current IB.

The bias voltage supplier 623 may supply the variable bias voltage Vpg2 to the reference cell 210 until the first comparison signal Cs1 at the first level transitions to the second level. Consequently, the bias voltage supplier 623 may serve to supply the bias voltage Vpg2 so that the reference cell current Iref2 flowing in the programmed reference cell 210 becomes equal to the internal bias current IB or within a given error range from the internal bias current IB.

The reference current generator 625 may generate a plurality of reference currents (e.g., the first reference current Imax and the second reference current Imin) based on the internal bias current IB. For example, the reference current generator 625 may generate the first reference current Imax and the second reference current Imin (where Imin<Imax) by mirroring the internal bias current IB. In at least this example, the first reference current Imax may have a value obtained by adding the internal bias current IB to a first reference value $\alpha$ (where $\alpha$ is a real number) or multiplying the internal bias current IB by the first reference value $\alpha$. The second reference current Imin may have a value obtained by adding the internal bias current IB to a second reference value $\beta$ (where $\beta<\alpha$ and $\beta$ is a real number) or multiplying the internal bias current IB by the second reference value $\beta$.

The second comparison unit 627 may include a plurality of comparators. For example, the second comparison unit 627 may include a first comparator 627-1 and a second comparator 627-2. The second comparison unit 627 may compare each of the plurality of reference currents (e.g., Imax and Imin) with the reference cell current Iref2 and output comparison signals (e.g., Cs2 and Cs3) based on a result of the comparison. The first comparator 627-1 may compare the first reference current Imax with the reference cell current Iref2 and output a second comparison signal Cs2. The second comparator 627-2 may compare the second reference current Imin with the reference cell current Iref2 and output a third comparison signal Cs3.

The digital code generator 629 may generate a digital code DC corresponding to the reference cell current Iref2 based on the plurality of comparison signals (e.g., Cs2 and Cs3) generated by the second comparison unit 627. The digital code DC may be generated in the manner as described with reference to FIG. 5.

The bias voltage supplier 623 may supply a bias voltage based on the digital code DC to fine trim the reference cell 210. For example, the bias voltage supplier 623 may supply a bias voltage for erasing the reference cell 210 to the reference cell 210 when the digital code DC is not the second code (e.g., when the second code is the first or third code, as in Case1 or Case3).

The semiconductor memory device 600 for trimming a single reference cell, illustrated in FIG. 6, is an example embodiment. It will be apparent that a semiconductor memory device according to at least some other example embodiments may include a plurality of reference cells and/or one or more internal bias current generators to respectively trim the plurality of reference cells. At least one internal bias current generated by at least one internal bias current generator may be used to trim at least one reference cell among the plurality of reference cells. As described above, example embodiments use an internal bias current source in reference cell trimming, thereby increasing the accuracy of the reference cell trimming and/or decreasing trimming test time.

While the example embodiments have been shown and described with reference to those illustrated in the drawings, it will be understood by those of ordinary skill in the art that various changes in form and detail may be made herein without departing from the spirit and scope of the present invention, as defined by the following claims.

What is claimed is:

1. A method of trimming a reference cell in a semiconductor memory device, the method comprising:
    generating an internal bias current capable of being trimmed;
    trimming an internal bias cell such that the internal bias current is within a given range; and
    trimming the reference cell based on the internal bias current, wherein the trimming the reference cell includes,
        programming the reference cell based on a variable program voltage,
        verifying a current flowing in the programmed reference cell based on the internal bias current, and
        fine trimming a verified current flowing in the reference cell based on a plurality of reference currents, the plurality of reference currents being generated based on the internal bias current, and wherein the fine trimming includes,
        generating a first reference current and a second reference current based on the internal bias current, the first reference current being greater than the internal bias current and the second reference current being less than the internal bias current,
        comparing each of the first reference current and the second reference current with the verified current, and
        performing the fine trimming of the reference cell based on a result of the comparison.

2. The method of claim 1, wherein the verifying the current flowing in the programmed reference cell includes,
    determining whether the current flowing in the programmed reference cell is within an error range from the internal bias current, and
    programming the reference cell until the current flowing in the programmed reference cell is within the error range from the internal bias current if the current flowing in the programmed reference cell is determined to be outside the error range.

3. The method of claim 1, wherein the fine trimming further includes,
    erasing the reference cell when the verified current flowing in the reference cell is greater than the first reference current or less than the second reference current,
    programming the erased reference cell, and
    repeating the verifying of the current flowing in the programmed reference cell.

4. The method of claim 1, wherein the fine trimming further includes,
    generating a digital code corresponding to the current flowing in the reference cell based on the result of comparing each of the first reference current and the second reference current with the verified current flowing in the reference cell, and
    performing the fine trimming of the reference cell based on the digital code.

5. A method of trimming a reference cell in a semiconductor memory device, the method comprising:
generating an internal bias current capable of being trimmed;
automatically trimming by programming the reference cell with a variable program voltage and verifying the programmed reference cell based on the internal bias current, and
performing fine trimming of the automatically trimmed reference cell based on at least two reference currents generated based on the internal bias current; wherein the automatically trimming includes,
programming the reference cell until a current flowing in the reference cell is within an error range from the internal bias current and wherein the fine trimming includes,
generating a first reference current and a second reference current based on the internal bias current, the first reference current being greater than the internal bias current and the second reference current being less than the internal bias current, and
fine trimming of the automatically trimmed reference cell based on a result of comparing each of the first reference current and the second reference current with the current flowing in the automatically trimmed reference cell.

6. The method of claim 5, wherein the fine trimming of the automatically trimmed reference cell includes,
erasing the reference cell when the current flowing in the automatically trimmed reference cell is greater than the first reference current or less than the second reference current, and
automatically trimming the erased reference cell.

7. The method of claim 5, wherein the fine trimming includes,
generating a digital code corresponding to the current flowing in the automatically trimmed reference cell based on the result of comparing each of the first reference current and the second reference current with the current flowing in the automatically trimmed reference cell, and
fine trimming of the reference cell based on the digital code.

8. A semiconductor memory device comprising:
at least one reference cell in which a reference cell current flows, the reference cell current being generated based on a bias voltage for programming the reference cell;
at least one internal bias current generator configured to generate an internal bias current capable of being trimmed; and
a trimming circuit configured to trim the reference cell based on the internal bias current; wherein
the trimming circuit is configured to program the reference cell until a current flowing in the reference cell is within an error range from the internal bias current, and further configured to trim the reference cell based on a result of comparing each of a plurality of reference currents with a current flowing in the programmed reference cell, the plurality of reference currents being generated based on the internal bias current.

9. The semiconductor memory device of claim 8, wherein the trimming circuit includes,
a first comparison circuit configured to compare the reference cell current with the internal bias current and output a first comparison signal,
a bias voltage supplier configured to supply the bias voltage for programming the reference cell based on the first comparison signal,
a reference current generator configured to generate the plurality of reference currents based on the internal bias current, and
a second comparison circuit configured to compare the plurality of reference currents with the reference cell current, and output a second comparison signal and a third comparison signal, wherein
the bias voltage supplier supplies the bias voltage to the reference cell based on the second and third comparison signals.

10. The semiconductor memory device of claim 9, wherein the second comparison circuit further includes,
a first comparator configured to compare a first of the plurality of reference currents with the reference cell current, and output the second comparison signal, and
a second comparator configured to compare a second of the plurality of reference currents with the reference cell current, and output the third comparison signal.

11. The semiconductor memory device of claim 9, wherein the trimming circuit further includes,
a digital code generator configured to generate a digital code corresponding to the reference cell current based on the second and the third comparison signal, and wherein
the bias voltage supplier supplies a bias voltage for erasing the reference cell to the reference cell based on the digital code.

12. The semiconductor memory device of claim 8, wherein the at least one reference cell includes,
a plurality of reference cells, each of the plurality of reference cells having a reference cell current flowing between a drain and a source based on a bias voltage for programming the reference cell, and
the trimming circuit is further configured to trim at least one of the reference cells based on the internal bias current.

13. The semiconductor memory device of claim 12, wherein the trimming circuit includes,
a first comparison circuit configured to compare the reference cell current flowing in at least one of the reference cells with the internal bias current and output a first comparison signal based on the comparison,
a bias voltage supplier configured to supply the bias voltage for programming the reference cell based on the first comparison signal,
a reference current generator configured to generate the plurality of reference currents based on the internal bias current, and
a second comparison circuit configured to compare the plurality of reference currents with the reference cell current, and output a second comparison signal and a third comparison signal, wherein
the bias voltage supplier supplies a bias voltage for erasing the reference cell based on the second and third comparison signals.

14. The semiconductor memory device of claim 13, wherein the second comparison circuit further includes,
a first comparator configured to compare a first of the plurality of reference currents with the reference cell current, and output the second comparison signal, and
a second comparator configured to compare a second of the plurality of reference currents with the reference cell current, and output the third comparison signal.

15. The semiconductor memory device of claim 14, wherein the trimming circuit further includes,
a digital code generator configured to generate a digital code corresponding to the reference cell current based on the outputs of the first and second comparators, and wherein the bias voltage supplier supplies a bias voltage for erasing the reference cell to the reference cell based on the digital code.

* * * * *